United States Patent
Uemura

(10) Patent No.: US 9,368,687 B2
(45) Date of Patent: Jun. 14, 2016

(54) GROUP-III NITRIDE SEMICONDUCTOR LIGHT-EMITTING ELEMENT AND MANUFACTURING METHOD THEREFOR

(71) Applicant: TOYODA GOSEI CO., LTD., Kiyosu-shi (JP)

(72) Inventor: Toshiya Uemura, Kiyosu (JP)

(73) Assignee: TOYODA GOSEI CO., LTD., Kiyosu-shi, Aichi-ken (JP)

(*) Notice: Subject to any disclaimer, the term of this patent is extended or adjusted under 35 U.S.C. 154(b) by 0 days.

(21) Appl. No.: 14/181,644

(22) Filed: Feb. 15, 2014

(65) Prior Publication Data
US 2014/0231853 A1    Aug. 21, 2014

(30) Foreign Application Priority Data
Feb. 18, 2013    (JP) .................... 2013-029514

(51) Int. Cl.
| | |
|---|---|
| *H01L 33/38* | (2010.01) |
| *H01L 33/32* | (2010.01) |
| *H01L 33/10* | (2010.01) |
| *H01L 33/00* | (2010.01) |

(52) U.S. Cl.
CPC .............. *H01L 33/38* (2013.01); *H01L 33/10* (2013.01); *H01L 33/32* (2013.01); *H01L 33/0079* (2013.01); *H01L 2924/0002* (2013.01); *H01L 2933/0016* (2013.01)

(58) Field of Classification Search
CPC ......... H01L 33/38; H01L 33/36; H01L 33/10; H01L 33/20; H01L 33/32; H01L 33/0079
See application file for complete search history.

(56) References Cited

U.S. PATENT DOCUMENTS

2003/0222270 A1* 12/2003 Uemura .................... 257/99
2005/0211997 A1   9/2005 Suehiro et al.
(Continued)

FOREIGN PATENT DOCUMENTS

| CN | 102683534 A | 9/2012 |
|---|---|---|
| CN | 102723415 A | 10/2012 |
| JP | 2006-066868 A | 3/2006 |

(Continued)

OTHER PUBLICATIONS

Japanese Office Action Mar. 1, 2016 with an English translation.

(Continued)

*Primary Examiner* — Whitney T Moore
(74) *Attorney, Agent, or Firm* — McGinn IP Law Group PLLC

(57) ABSTRACT

A group-III nitride semiconductor light emitting element includes a semiconductor layer that includes a light emitting layer, a p-type semiconductor layer and an n-type semiconductor layer, a p-contact electrode that is in contact with the p-type semiconductor layer, an n-contact electrode that is in contact with the n-type semiconductor layer, and a support substrate that supports the semiconductor layer. The p-contact electrode and the n-contact electrode are disposed at a position between the semiconductor layer and the support substrate. In a case where the p-contact electrode and the n-contact electrode are orthogonally projected on a plate surface of the support substrate, the p-contact electrode and the n-contact electrode are formed in a shape in which the orthogonally projected p-contact electrode and the orthogonally projected n-contact electrode are not overlapped with each other.

17 Claims, 12 Drawing Sheets

(56) References Cited

U.S. PATENT DOCUMENTS

2008/0296573 A1    12/2008   Suehiro et al.
2011/0284866 A1*   11/2011   Tran et al. ........................ 257/76

FOREIGN PATENT DOCUMENTS

| JP | 2006-148087 A | 6/2006 |
| JP | 2007-158128 A | 6/2007 |
| JP | 2010-161160 A | 7/2010 |
| JP | 2011-216524 A | 10/2011 |
| JP | 2012-129281 A | 7/2012 |

OTHER PUBLICATIONS

Chinese Office Action dated Mar. 30, 2016 with an English translation.

* cited by examiner

FIG. 17
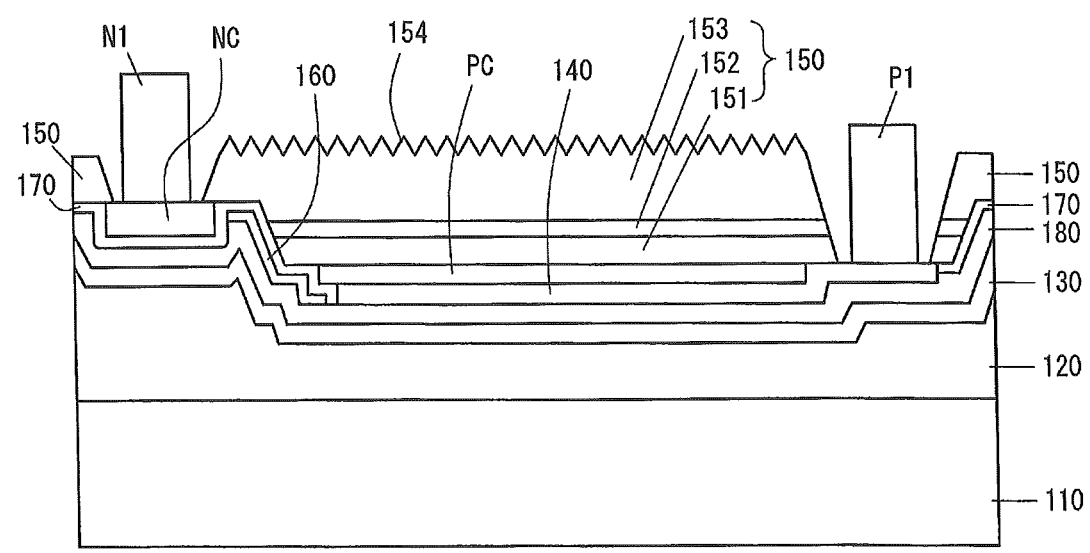
FIG. 18  --Related Art---
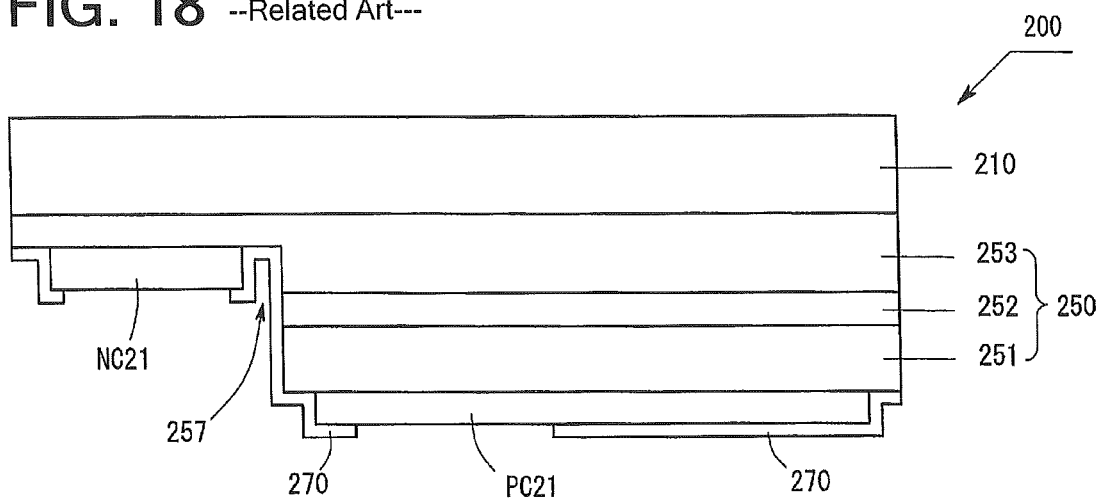

FIG. 19 --Related Art---
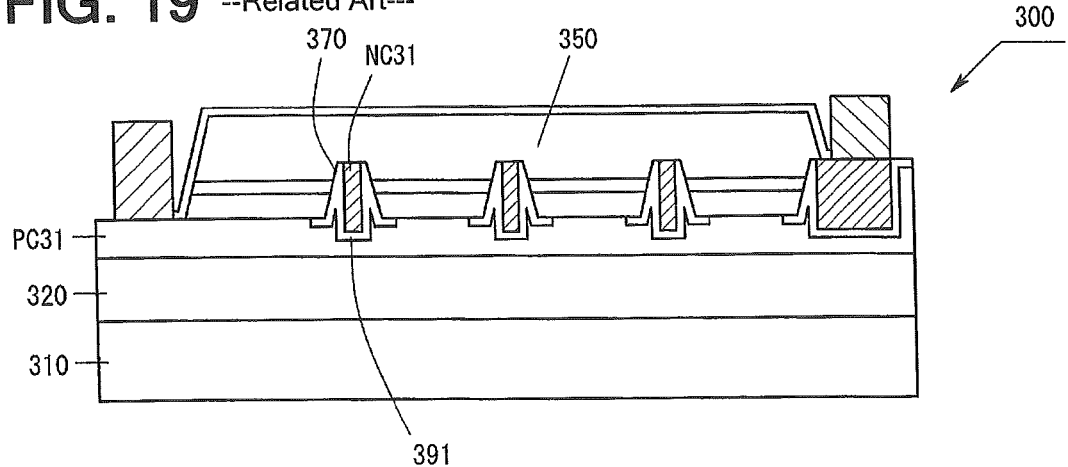
FIG. 20
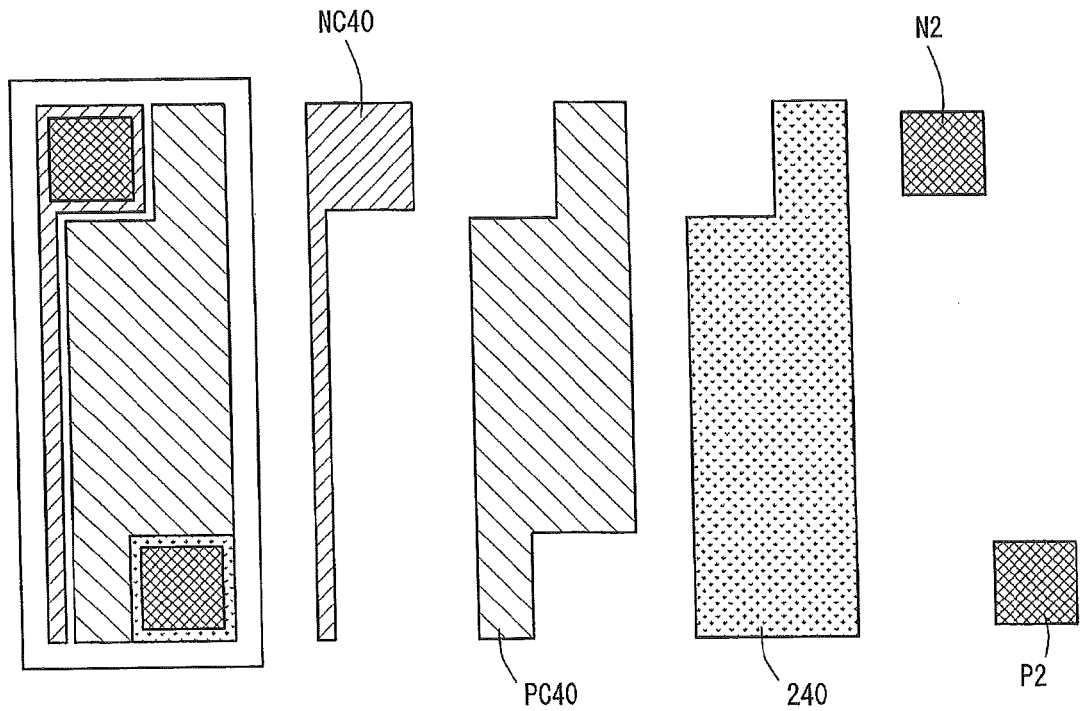

GROUP-III NITRIDE SEMICONDUCTOR LIGHT-EMITTING ELEMENT AND MANUFACTURING METHOD THEREFOR

CROSS REFERENCE TO RELATED APPLICATION

This application is based on Japanese Patent Application No. 2013-029514 filed on Feb. 18, 2013, the contents of which are incorporated herein by reference.

TECHNICAL FIELD

The present invention relates to a group-III nitride semiconductor light emitting element and a manufacturing method therefor. More specifically, the present invention relates to a group-III nitride semiconductor light emitting element that is capable of suppressing the occurrence of leakage current between a p-electrode and an n-electrode and a manufacturing method therefor.

BACKGROUND ART

As an example of a group-III nitride semiconductor light emitting element, there are an embedded light emitting element in which a contact electrode is embedded in a light emitting element and a grooved light emitting element and a grooved light emitting element in which a contact electrode is simply formed on a contact layer that is exposed by digging a groove. For example, the embedded light emitting element is disclosed in JP-A-2011-216514 (see, FIG. 2, etc.).

In the light emitting element disclosed in JP-A-2011-216514, a p-contact electrode (109) and an n-contact electrode (103) are embedded in the light emitting element. Further, the p-contact electrode (109) and the n-contact electrode (103) are formed to sandwich a thin insulating film (110) therebetween. Here, the p-contact electrode (109) is formed over the entire region of a light emitting surface.

Therefore, in the light emitting element disclosed in JP-A-2011-216514, there are sites where the p-contact electrode (109) and the n-contact electrode (103) are opposed to each other via the thin insulating film (110) (see, FIG. 2, etc., in JP-A-2011-216514). Accordingly, in these sites, a strong electric field is formed between the p-contact electrode (109) and the n-contact electrode (103).

In the light emitting element disclosed in JP-A-2011-216514, there is a possibility that leakage occurs at the site of the thin insulating film (110). When this light emitting element is used continuously, metal atoms move along the grain boundary of the thin insulating film (110) and a path connecting the p-contact electrode (109) and the n-contact electrode (103) to each other is formed whereby there is a possibility that the leakage current occurs. Further, the service life of the light emitting element is short. In addition, there is a possibility that initial failure occurs. That is, the yield is poor.

On the other hand, in the grooved light emitting element, as described in more detail at the comparison between the illustrative embodiments (to be described later) and a conventional example, originally, there is little possibility that the p-contact electrode and the n-contact electrode are conducted to each other even when the insulating film is not provided. Accordingly, the following issues are unique to the embedded light emitting element.

The present invention has been made to solve the above-described problems of a prior art. That is, an object of the present invention is to provide a group-III nitride semiconductor light emitting element that is capable of suppressing the occurrence of leakage current in an embedded element where a contact electrode is disposed in a state of being embedded between a semiconductor layer and a support substrate and a manufacturing method therefor.

[1] According to an aspect of the invention, a group-III nitride semiconductor light emitting element includes a semiconductor layer that includes a light emitting layer, a p-type semiconductor layer and an n-type semiconductor layer, a p-contact electrode that is in contact with the p-type semiconductor layer, an n-contact electrode that is in contact with the n-type semiconductor layer, and a support substrate that supports the semiconductor layer. The p-contact electrode and the n-contact electrode are disposed at a position between the semiconductor layer and the support substrate. In a case where the p-contact electrode and the n-contact electrode are orthogonally projected on a plate surface of the support substrate, the p-contact electrode and the n-contact electrode are formed in a shape in which the orthogonally projected p-contact electrode and the orthogonally projected n-contact electrode are not overlapped with each other.

In the group-III nitride semiconductor light emitting element, an electric field in a direction perpendicular to a light extraction surface is not applied between the p-contact electrode and the n-contact electrode. Accordingly, initial failure is reduced and therefore the yield is good. Further, there is little possibility that leakage current occurs between the p-contact electrode and the n-contact electrode by continuous use.

[2] The group-III nitride semiconductor light emitting element of [1] further includes a first passivation film disposed at a position between the p-contact electrode and the n-contact electrode.

At this time, the first thin passivation film is in a position between the p-contact electrode and the n-contact electrode. However, the p-contact electrode and the n-contact electrode do not face each other through the first passivation film. Therefore, there is little possibility that a strong electric field is formed in a film thickness direction of the first passivation film. Accordingly, the occurrence of leakage current is suppressed.

[3] In the group-III nitride semiconductor light emitting element of [1] or [2], the p-contact electrode includes a comb-like p-wiring electrode part, the n-contact electrode includes a comb-like n-wiring electrode part, and in a case where the p-wiring electrode part and the n-wiring electrode part are orthogonally projected on the plate surface of the support substrate, the orthogonally projected p-wiring electrode part and the orthogonally projected n-wiring electrode part are arranged to be engaged with each other.

Since the p-contact electrode and the n-contact electrode are arranged to be engaged with each other in a comb-like shape, the current is sufficiently diffused in the light emitting layer. Therefore, light emitting efficiency is good.

[4] The group-III nitride semiconductor light emitting element of any one of [1] to [3], further includes a first metal layer that is in contact with the p-contact electrode. In a case where the first metal layer and the n-contact electrode are orthogonally projected on the plate surface of the support substrate, the first metal layer and the n-contact electrode are formed in a shape in which the orthogonally projected first metal layer and the orthogonally projected n-contact electrode are not overlapped with each other.

Therefore, there is little possibility that leakage current occurs between the first metal layer and the n-contact electrode.

[5] The group-III nitride semiconductor light emitting element of [4] includes a p-pad electrode that is formed on the first metal layer and an n-pad electrode that is formed on the n-contact electrode. The p-pad electrode and the n-pad electrode are exposed on a surface opposite to the side where the support substrate is disposed, as seen from the semiconductor layer.

[6] The group-III nitride semiconductor light emitting element of [4] or [5] further includes a bonding layer that is located between the first metal layer and the support substrate and containing solder, and a second metal layer that is formed over the entire surface of the bonding layer on the semiconductor layer side. The second metal layer is a cover metal layer for preventing the solder contained in the bonding layer from being diffused toward the first metal layer.

[7] The group-III nitride semiconductor light emitting element of [6] further includes a second passivation film that is formed over the entire surface of the second metal layer on the semiconductor layer side.

[8] The group-III nitride semiconductor light emitting element of any one of [1] to [7] further includes a reflective film that is disposed at a position between the semiconductor layer and the support substrate. In a case where the reflective film, the p-contact electrode and the n-contact electrode are orthogonally projected on the plate surface of the support substrate, the orthogonally projected reflective film is disposed at a position between the orthogonally projected p-contact electrode and the orthogonally projected re-contact electrode.

[9] A method of manufacturing a group-III nitride semiconductor light emitting element includes a semiconductor layer forming process for growing a semiconductor layer including a light emitting layer, a p-type semiconductor layer and an n-type semiconductor layer on a grow substrate, a recess forming process for forming a recess on the semiconductor layer from the p-type semiconductor layer side to expose a portion of the n-type semiconductor layer, an n-contact electrode forming process for forming an n-contact electrode on the n-type semiconductor layer that is exposed to the recess, a p-contact electrode forming process for forming a p-contact electrode on the p-type semiconductor layer, a bonding process for bonding a laminate including a support substrate to a base material including the semiconductor layer from the position opposite to the growth substrate to form a bonding body and, a growth substrate removal process for removing the growth substrate from the bonding body. In the n-contact electrode forming process and the p-contact electrode forming process, in a case of being orthogonally projected on a plate surface of the support substrate, the p-contact electrode and the n-contact electrode are formed in a shape in which the orthogonally projected p-contact electrode and the orthogonally projected n-contact electrode are not overlapped with each other, and in the bonding process, the p-contact electrode and the n-contact electrode are bonded so as to be disposed at a position between the semiconductor layer and the support substrate.

[10] The method of manufacturing the group-III nitride semiconductor light emitting element according to [9] further includes a passivation film forming process for forming a passivation film that insulates between the p-contact electrode and the n-contact electrode.

According to the present invention, it is possible to provide a group-III nitride semiconductor light emitting element that is capable of suppressing the occurrence of leakage current in an embedded element where the contact electrode is disposed in a state of being embedded between the semiconductor layer and the support substrate and a manufacturing method therefor.

BRIEF DESCRIPTION OF THE DRAWINGS

FIG. 17 is a view (eleventh view) for explaining a method of manufacturing the light emitting element according to the illustrative embodiment.

FIG. 18 is a view (first view) for explaining a conventional light emitting element.

FIG. 19 is a view (second view) for explaining a conventional light emitting element.

FIG. 20 is a view for explaining a light emitting element according to a modification.

DESCRIPTION OF PREFERRED EMBODIMENT

Hereinafter, specific embodiments of a semiconductor light emitting element will be described illustratively with reference to the accompanying drawings. However, the present invention is not limited to these embodiments. Further, a laminated structure of the semiconductor light emitting element (to be described later) is merely examples. It is natural that a laminated structure different from the illustrative embodiments may be used. The thickness of each layer in respective drawings does not represent an actual thickness but is shown conceptually.

1. Semiconductor Light Emitting Element

Figure 1:
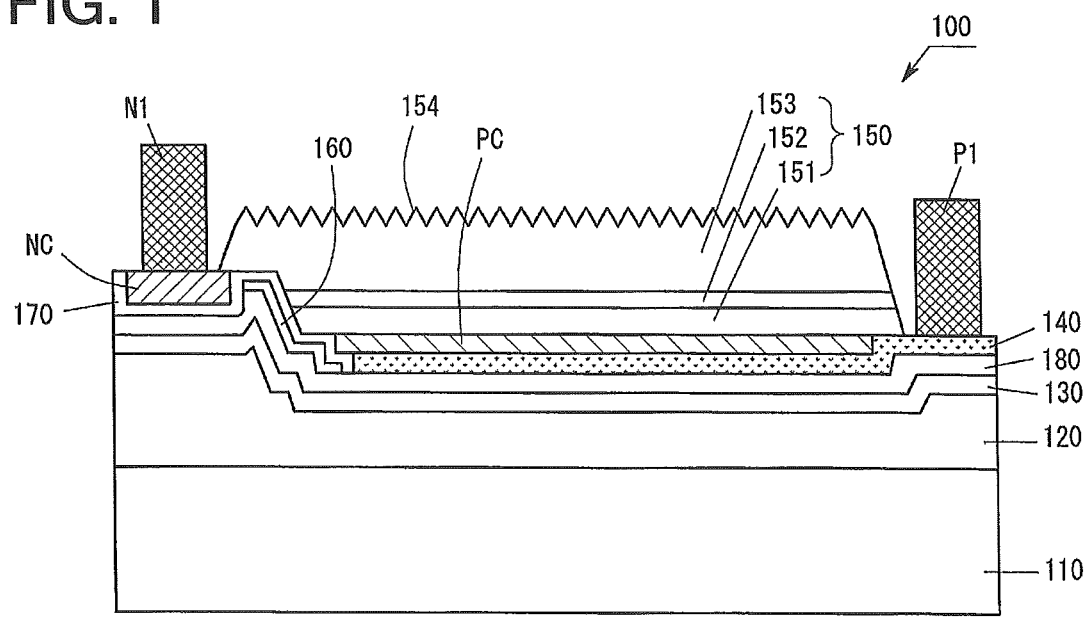
FIG. 1 is a view showing a structure of a light emitting element according to an illustrative embodiment.

FIG. 1 is a sectional view showing a structure of a light emitting element 100 according to the present embodiment. Here, the cross section shown in FIG. 1 corresponds to the cross section taken along a line A-A in FIG. 2. The light emitting element 100 is a substrate lift-off type semiconductor light emitting element, from which a growth substrate is removed. The light emitting element 100 includes a support substrate 110, a bonding layer 120, a cover metal layer 130, an etching stop layer 140, a semiconductor layer 150, a reflective film 160, a passivation film 170, a passivation film 180, a p-contact electrode PC, an n-contact electrode NC, a p-electrode P1 and an n-electrode N1. In FIG. 1, the etching stop layer 140, the p-contact electrode PC, the n-contact electrode NC, the p-electrode P1 and the n-electrode N1 are hatched.

The semiconductor layer 150 includes a plurality of layers made of group-III nitride semiconductor. Here, the group-III nitride semiconductor refers to a semiconductor that is indicated by $Al_xIn_yGa_zN$ ($x+y+z=1$, $0 \leq x \leq 1$, $0 \leq y \leq 1$, $0 \leq z \leq 1$). The semiconductor layer 150 includes a p-type semiconductor layer 151, a light emitting layer 152 and an n-type semiconductor layer 153. The light emitting layer 152 includes a well layer and a barrier layer. The structure of the light emitting layer 152 may be a single quantum well structure (SQW) or a multiple quantum well structure (MQW). The p-type semiconductor layer 151 includes a p-type clad layer and a p-type contact layer. The n-type semiconductor layer 153 includes an n-type clad layer and an n-type contact layer. Further, a surface of the n-type semiconductor layer 153 opposite to the light emitting layer 152 is a roughened light extraction surface 154. In this way, the light extraction surface 154 is provided on a side to which the n-electrode N1 is exposed, i.e., on the side opposite to the support substrate 110. The staked structure of these semiconductor layers 150 is merely example and other staked structures may be employed.

The support substrate 110 is intended to prevent deformation of the light emitting element 100 by supporting the semiconductor layer 150. Material of the support substrate 110 is a ceramic substrate, for example. The bonding layer 120 is a layer containing Au—Sn based solder. Other bonding layers may be employed, as long as the bonding layer can bond the support substrate and a laminate including the semiconductor layer 150.

The cover metal layer 130 is a layer for preventing electromigration. For example, the cover metal layer 130 prevents the solder (i.e., Au, Sn) contained in the bonding layer 120 from being diffused toward the etching stop layer 140. To this end, the cover metal layer 130 is formed over the entire surface of the bonding layer 120 on the semiconductor layer 150 side. Material of the cover metal layer 130 includes metals such as Ni, Ti, Pt, W or alloy thereof.

The etching stop layer 140 is a metal layer for stopping the etching of dry etching that is carried out in a manufacturing process (to be described later). To this end, the etching stop layer 140 configures a bottom surface of the recess that is formed by the dry etching. Further, the etching stop layer 140 is in contact with the p-contact electrode PC. In addition, the etching stop layer 140 is also in contact with the p-electrode P1. Therefore, the p-electrode P1 is conducted to the p-contact electrode PC through the etching stop layer 140. Material of the etching stop layer 140 includes metals such as Ni, Al, Pt or alloy thereof, for example.

The reflective film 160 is a film for reflecting the light generated from the light emitting layer 152 toward the light extraction surface 154. When the reflective film 160, the p-contact electrode PC and the n-contact electrode NC are orthogonally projected on a plate surface of the support substrate 110, the orthogonally projected reflective film 160 is disposed at a position between the orthogonally projected p-contact electrode PC and the orthogonally projected n-contact electrode NC. Further, the reflective film 160 is disposed at a position between the semiconductor layer 150 and the support substrate 110. Therefore, the light emitted toward the support substrate 110 in the light emitting layer 152 is reflected by the reflective film 160 or the etching stop layer 140. The light is also reflected in the p-contact electrode PC when the material of the p-contact electrode PC is not a translucent material. Further, the light may be reflected by the cover metal layer 130. Material of the reflective film 160 is Ag, Al, Rh, Pt, Ru, Ni, Ti, W and alloy thereof, for example.

The passivation film 170 is an insulating film covering the n-contact electrode NC. The passivation film 170 is disposed between the p-contact electrode PC and the n-contact electrode NC. This is intended to insulate the p-contact electrode PC and the n-contact electrode NC. Material of the passivation film 170 is $SiO_2$ or $Si_3N_4$, for example.

The passivation film 180 is an insulating film that is formed over the entire surface of the cover metal layer 130 on the semiconductor layer 150 side. The thickness of the passivation film 180 is sufficiently thick. Material of the passivation film 180 may be the same as the passivation film 170. Since the passivation film 180 is formed over the entire surface of the cover metal layer 130, current does not flow in the cover metal layer 130 during light emission of the light emitting element 100. Therefore, electric field is almost not formed between the cover metal layer 130 and the n-contact electrode NC.

The p-contact electrode PC is intended to be conducted to the p-type semiconductor layer 151. Further, the p-contact electrode PC is in contact with a p-type contact layer of the p-type semiconductor layer 151. The p-contact electrode PC is disposed at a position between the semiconductor layer 150 and the support substrate 110. Material of the p-contact electrode PC is ITO or IZO, for example. Further, the material of the p-contact electrode PC is Ag, Rh, Pt, Ru or alloy thereof. In addition, the p-contact electrode PC also serves as a reflective layer for reflecting the light emitted from the semiconductor layer 150. Therefore, a high-reflective metal layer such as Ag, Al, Rh, Ru is laminated when a translucent conductive layer such as ITO or IZO is brought into contact with the p-type semiconductor layer 151.

The n-contact electrode NC is intended to be conducted to the n-type semiconductor layer 153. Further, the n-contact electrode NC is in contact with an n-type contact layer of the n-type semiconductor layer 153. The n-contact electrode NC is disposed at a position between the semiconductor layer 150 and the support substrate 110. The n-contact electrode NC has a structure (V/Al) in which V and Al are formed in order from the n-type semiconductor layer 153 side, for example. Alternatively, the n-contact electrode NC may be Ti/Al, V/Au, Ti/Au or Ni/Au.

The p-electrode P1 is a pad electrode that is conducted to the p-type semiconductor layer 151. The p-electrode P1 is formed on the etching stop layer 140. The p-electrode P1 is conducted to the p-type semiconductor layer 151 through the etching stop layer 140 and the p-contact electrode PC. The p-electrode P1 has a structure (Ti/Au) in which Ti and Au are formed in order from the etching stop layer 140 side. Alternatively, the p-electrode may be Ti/Al, V/Al, V/Au or Ti/Ni/Au. Further, Zr, W, Ta, Cr or the like may be used, instead of Ti and V. Desirably, an outermost surface of the p-electrode P1 is Au or Al in order to improve adhesion by wire bonding.

The n-electrode N1 is a pad electrode that is conducted to the n-type semiconductor layer 153. The n-electrode N1 is formed on the n-contact electrode NC. Material of the n-electrode N1 may be the same as the n-contact electrode NC. Further, Zr, W, Ta, Cr or the like may be used. Further, the p-electrode P1 and the n-electrode N1 may be simultaneously formed of the same material. The p-electrode P1 and the n-electrode N1 are exposed at a position on the side opposite to the support substrate 110.

2. Laminated Structure of Semiconductor Light Emitting Element

Figure 2:
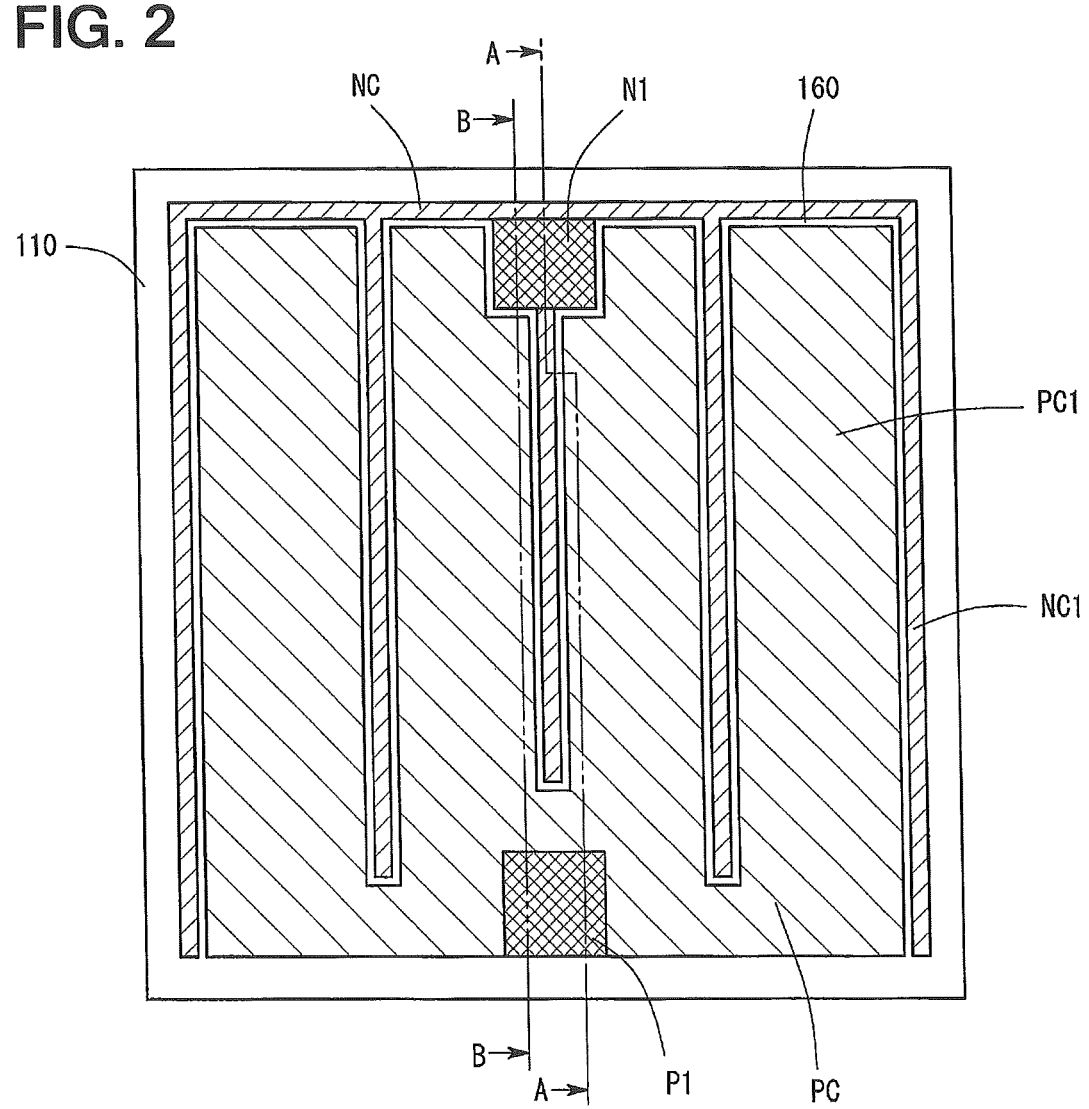
FIG. 2 is a plan view showing a metal layer taken out from the light emitting element according to the illustrative embodiment.

Now, the structure and shape of each part of the light emitting element 100 are described. FIG. 2 is an upper perspective view of the support substrate 110, the p-contact electrode PC, the n-contact electrode NC, the p-electrode P1, the n-electrode N1 and the reflective film 160 taken out from the light emitting element 100.

In order words, FIG. 2 is a projection view in which each part of the light emitting element is orthogonally projected on a plate surface of the support substrate 110. Here, in a case where the p-contact electrode PC and the n-contact electrode NC are orthogonally projected on a plate surface of the support substrate 110, the p-contact electrode PC and the n-contact electrode NC are formed in a shape in which the orthogonally projected p-contact electrode PC and the orthogonally projected n-contact electrode NC are not overlapped with each other. Further, a gap in the range of 3 μm or more and 30 μm or less is formed between the p-contact electrode PC and the n-contact electrode NC. As shown in FIG. 2, the reflective film 160 is formed along this gap.

2-1. Shape or the like of N-Contact Electrode

Figure 3:
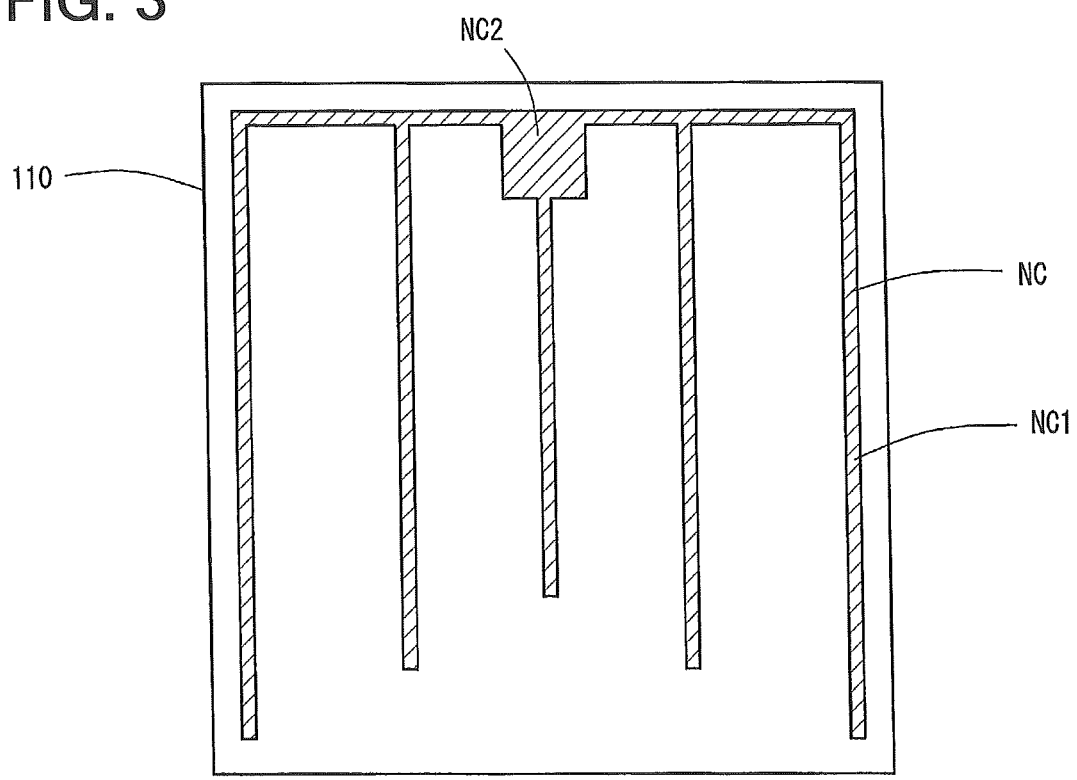
FIG. 3 is a plan view showing the shape of an n-contact electrode of the light emitting element according to the illustrative embodiment.

FIG. 3 is a plan view of the n-contact electrode NC. Here, the support substrate 110 is also shown as a reference. The n-contact electrode NC includes an n-wiring electrode part NC1 and an n-pad arrangement part NC2. The n-wiring electrode part NC1 has a comb-like shape. The n-pad arrangement part NC2 is a site where the n-electrode N1 is formed.

2-2. Shape or the like of P-Contact Electrode

Figure 4:
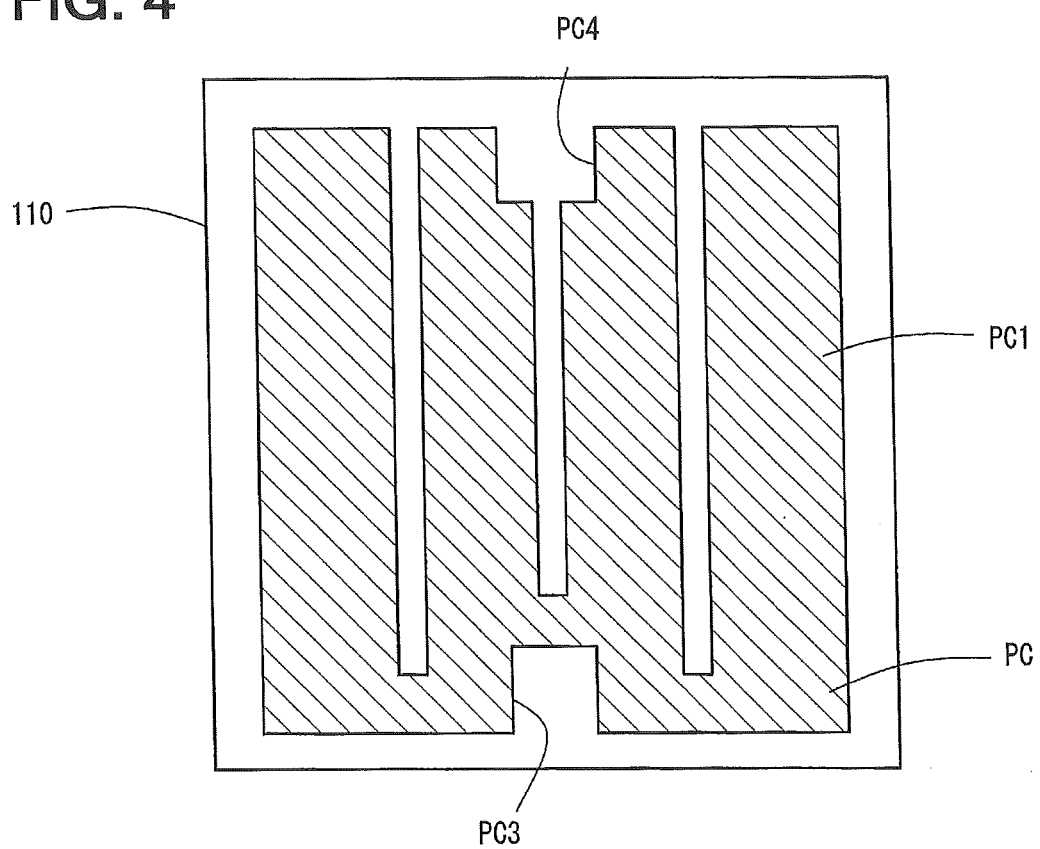
FIG. 4 is a plan view showing the shape of a p-contact electrode of the light emitting element according to the illustrative embodiment.

FIG. 4 is a plan view of the p-contact electrode PC. Here, the support substrate 110 is also shown as a reference. The p-contact electrode PC includes a p-wiring electrode part PC1, a notched part PC3 and a notched part PC4. The p-wiring electrode part PC1 has a comb-like shape. Each of the notched portion PC3 and the notched portion PC4 is a notch-shaped portion for forming the p-electrode P1 and the n-electrode N1 while exposing the p-electrode P1 and the n-electrode N1.

Here, in a case where the p-wiring electrode part PC1 and the n-wiring electrode part NC1 are orthogonally projected on the plate surface of the support substrate 110, the orthogonally projected p-wiring electrode part PC1 and the orthogonally projected n-wiring electrode part NC1 are arranged to be engaged with each other. These engaging shape and arrangement are shown in FIG. 2.

2-3. Shape or the like of Etching Stop Layer

Figure 5:
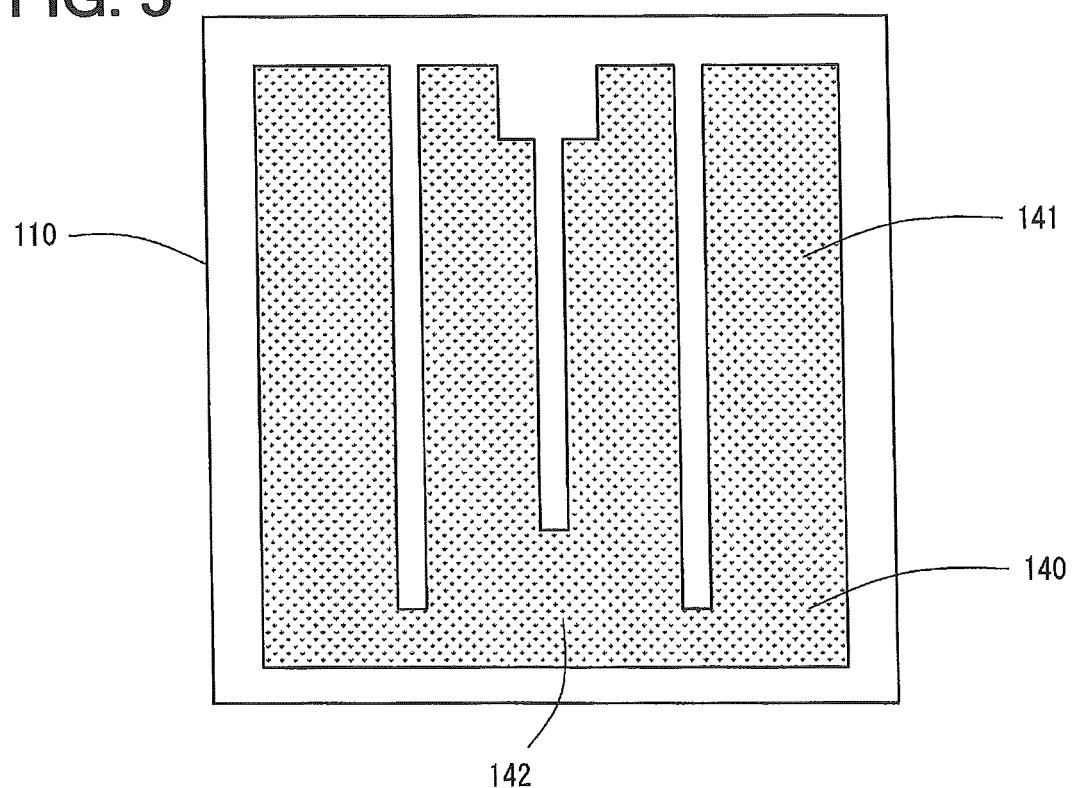
FIG. 5 is a plan view showing the shape of an etching stop layer of the light emitting element according to the illustrative embodiment.

FIG. 5 is a plan view of the etching stop layer 140. Here, the support substrate 110 is also shown as a reference. The etching stop layer 140 has a shape similar to the p-contact electrode PC (see FIG. 4). The etching stop layer 140 includes a wiring electrode-shaped part 141 and a p-pad electrode forming part 142. Except for the p-pad electrode forming part 142, the etching stop layer 140 has substantially the same shape as the p-contact electrode PC.

In a case where the etching stop layer 140 and the n-contact electrode NC are orthogonally projected on the plate surface of the support substrate 110, the etching stop layer 140 and the n-contact electrode NC are formed in a shape in which the orthogonally projected etching stop layer 140 and the orthogonally projected n-contact electrode NC are not overlapped with each other.

2-4. Pad Electrode

Figure 6:
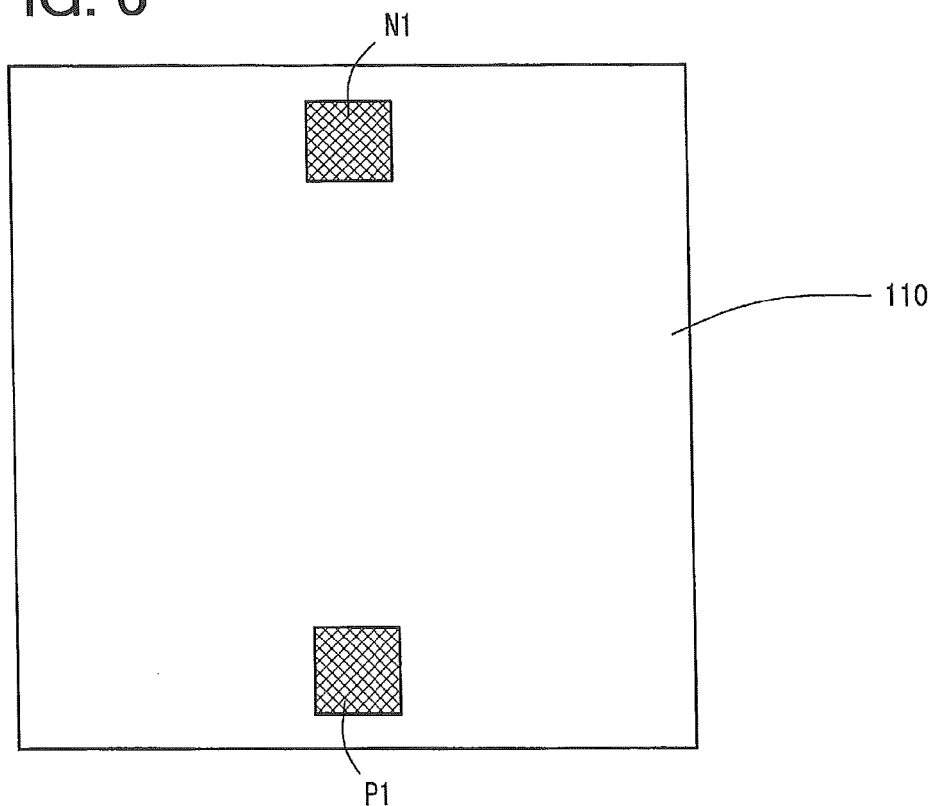
FIG. 6 is a plan view showing the shape of a pad electrode of the light emitting element according to the illustrative embodiment.

FIG. 6 is a plan view of the p-electrode P1 and the n-electrode N1. Here, the support substrate 110 is also shown as a reference. Further, as shown in FIG. 1, both the p-electrode P1 and the n-electrode N1 are exposed on a surface opposite to the side in which the support substrate 110 is disposed, as seen from the semiconductor layer 150.

3. Method of Manufacturing Semiconductor Light Emitting Element

Next, a method of manufacturing the light emitting element 100 according to the present embodiment is described with reference to FIG. 7 to FIG. 17. In each manufacturing process of FIG. 7 to FIG. 17, a cross section corresponding to the cross section taken along a line B-B in FIG. 2 is shown. Further, in FIG. 7 to FIG. 12, a sapphire substrate S10 that is a growth substrate is drawn in the upper side of the drawings and the semiconductor layer 150 is grown on the lower side of the sapphire substrate S10 in the drawings. However, actually, it is considered that a main surface of the sapphire substrate S10 is arranged to face upward in the drawings and the semiconductor layer 150 is grown on the main surface of the sapphire substrate S10.

3-1. Semiconductor Layer Forming Process

Figure 7:
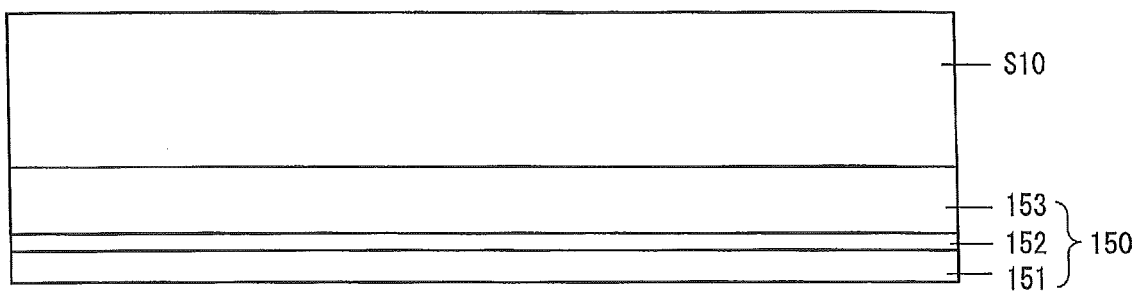
FIG. 7 is a view (first view) for explaining a method of manufacturing the light emitting element according to the illustrative embodiment.

Crystal of each semiconductor layer made of a group-III nitride semiconductor is epitaxially grown by a metal-organic vapor phase growth (MOCVD). As shown in FIG. 7, the semiconductor layer 150 is formed on the main surface of the sapphire substrate S10 that is a growth substrate. The n-type semiconductor layer 153, the light emitting layer 152 and the p-type semiconductor layer 151 are formed in order from the sapphire substrate S10 side. Further, prior to forming the semiconductor layer 150, a low-temperature buffer layer such as AlN may be formed.

3-2. Recess Forming Process

Figure 8:
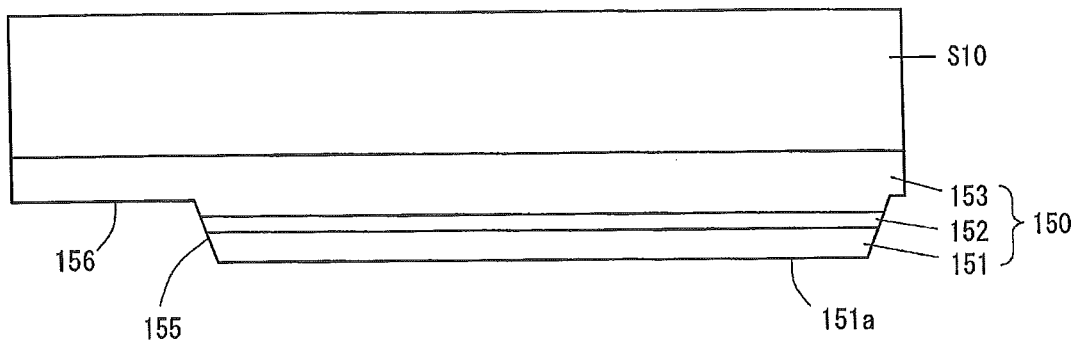
FIG. 8 is a view (second view) for explaining a method of manufacturing the light emitting element according to the illustrative embodiment.

Subsequently, a recess 155 is formed in the semiconductor layer 150 by dry etching. At this time, $SiO_2$ may be used as a mask. As shown in FIG. 8, the recess 155 is a blind hole that reaches the n-type semiconductor layer 153 from the p-type semiconductor layer 151 side. The n-type contact layer 156 of the n-type semiconductor layer 153 is exposed at the bottom of the recess 155. The shape of the recess 155 is similar to the shape of the n-contact electrode NC shown in FIG. 3.

3-3. N-Contact Electrode Forming Process

Figure 9:
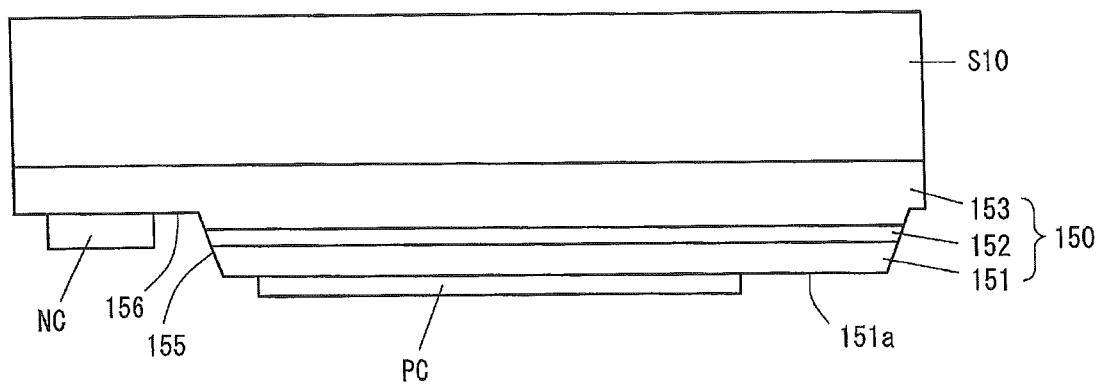
FIG. 9 is a view (third view) for explaining a method of manufacturing the light emitting element according to the illustrative embodiment.

Then, as shown in FIG. 9, the n-contact electrode NC is formed on the n-type contact layer 156 exposed at the recess 155. Here, the n-contact electrode NC including a comb-like n-wiring electrode part NC1 is formed.

3-4. P-Contact Electrode Forming Process

Subsequently, the p-contact electrode PC is formed on the p-type contact layer 151a of the p-type semiconductor layer 151 using a sputtering method, as shown in FIG. 9. Here, the p-contact electrode PC has a comb-like shape. Then, the comb-like p-wiring electrode part PC1 is formed in a shape engaged with the n-wiring electrode part NC1 of the n-contact electrode NC.

Therefore, in a case of being orthogonally projected on the plate surface of the sapphire substrate S10, the p-wiring electrode part PC1 and the n-wiring electrode part NC1 are arranged in a shape and position where the orthogonally projected p-wiring electrode part PC1 and the orthogonally projected n-wiring electrode part NC1 are not overlapped with each other. Although being orthogonally projected on the sapphire substrate S10 in the present embodiment, there is no change in the fact that the p-wiring electrode part PC1 and the n-wiring electrode part NC1 are arranged in a shape and position where these electrode parts are not overlapped with each other even in a case of being orthogonally projected on a light emitting surface of the light emitting layer 152 or on the support substrate 110 that is attached in the subsequent process.

3-5. First Passivation Film Forming Process

Figure 10:
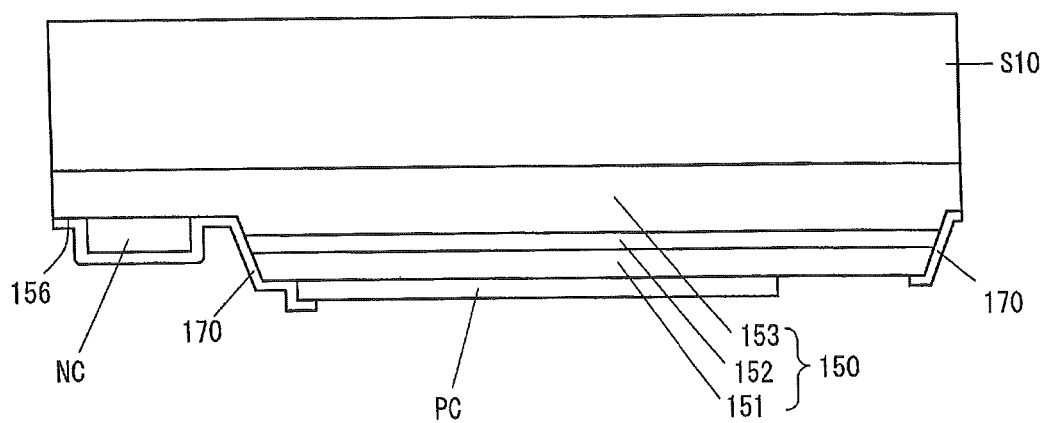
FIG. 10 is a view (fourth view) for explaining a method of manufacturing the light emitting element according to the illustrative embodiment.

Then, as shown in FIG. 10, the passivation film 170 is formed to cover the n-contact electrode NC. In this way, the n-contact electrode NC is covered by the n-type contact layer 156 of the semiconductor layer 150 and the passivation film 170.

3-6. Etching Stop Layer Forming Process

Figure 11:
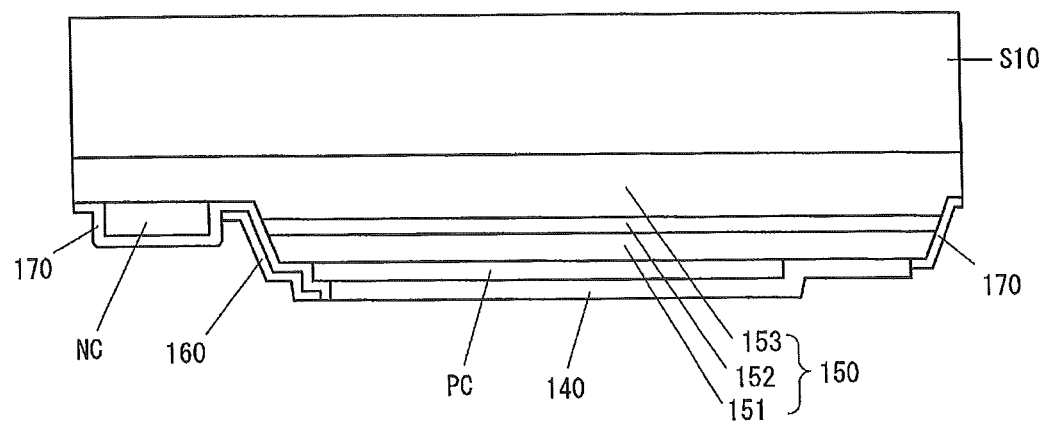
FIG. 11 is a view (fifth view) for explaining a method of manufacturing the light emitting element according to the illustrative embodiment.

Subsequently, as shown in FIG. 11, the etching stop layer 140 is formed on the p-contact electrode PC. At this time, the etching stop layer 140 covers the p-contact electrode PC and also covers a portion of the passivation film 170 and the portion of the p-type contact layer 151a that is exposed. The etching stop layer 140 is in charge of stopping the progress of dry etching of a pad electrode forming process that is performed at a later stage.

3-7. Reflective Film Forming Process

Subsequently, as shown in FIG. 11, the reflective film 160 is formed on a portion of the passivation film 170. The reflective film 160 is disposed at a position between the p-contact electrode PC and the n-contact electrode NC when being orthogonally projected on the plate surface of the sapphire substrate S10. The reflective film 160 is intended to reflect the light emitted toward the passivation film 170 from the light emitting layer 152.

3-8. Second Passivation Film Forming Process

Figure 12:
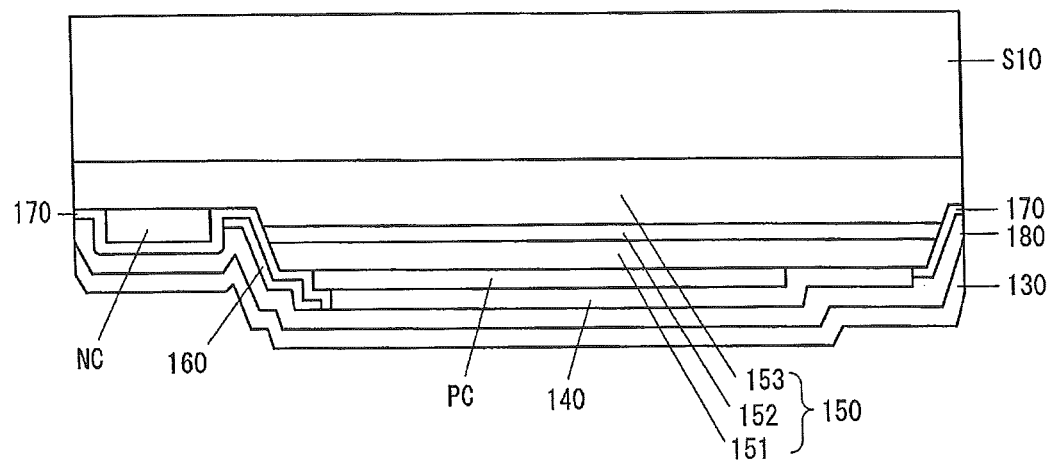
FIG. 12 is a view (sixth view) for explaining a method of manufacturing the light emitting element according to the illustrative embodiment.

Subsequently, as shown in FIG. 12, the passivation film 180 is formed over the entire surface of the etching stop layer 140, the reflective film 160 and the passivation film 170.

3-9. Cover Metal Layer Forming Process

Subsequently, as shown in FIG. 12, the cover metal layer 130 is formed on the passivation film 180. Here, the cover metal layer 130 is formed over the entire surface of a wafer.

3-10. Bonding Process

Figure 13:
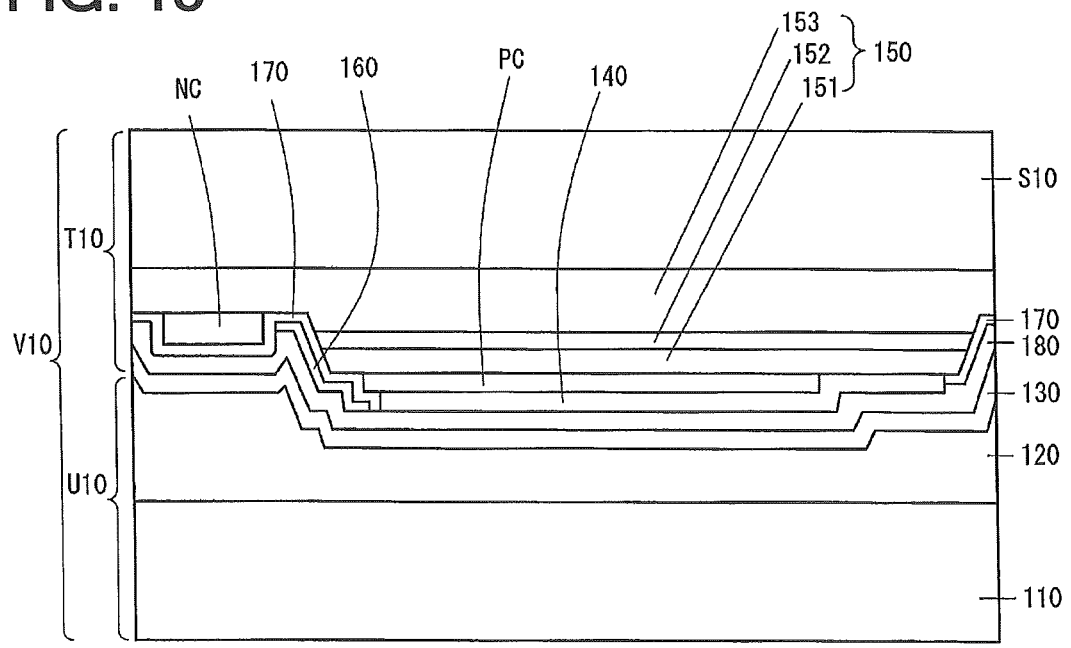
FIG. 13 is a view (seventh view) for explaining a method of manufacturing the light emitting element according to the illustrative embodiment.

Subsequently, as shown in FIG. 13, a laminate (base material) T10 including the semiconductor layer 150 and a laminate U10 including the support substrate 110 are solder-bonded to each other. At this time, the solder is formed on the surface of the laminate T10 including the semiconductor layer 150, which faces the support substrate 110. With this solder-bonding, the laminate T10 including the semiconductor layer 150 and the laminate U10 including the support substrate 110 are integrally bonded to form a bonding body V10. By doing so, the p-contact electrode PC and the n-contact electrode NC are disposed between the semiconductor layer 150 and the support substrate 110.

3-11. Growth Substrate Removal Process

Figure 14:
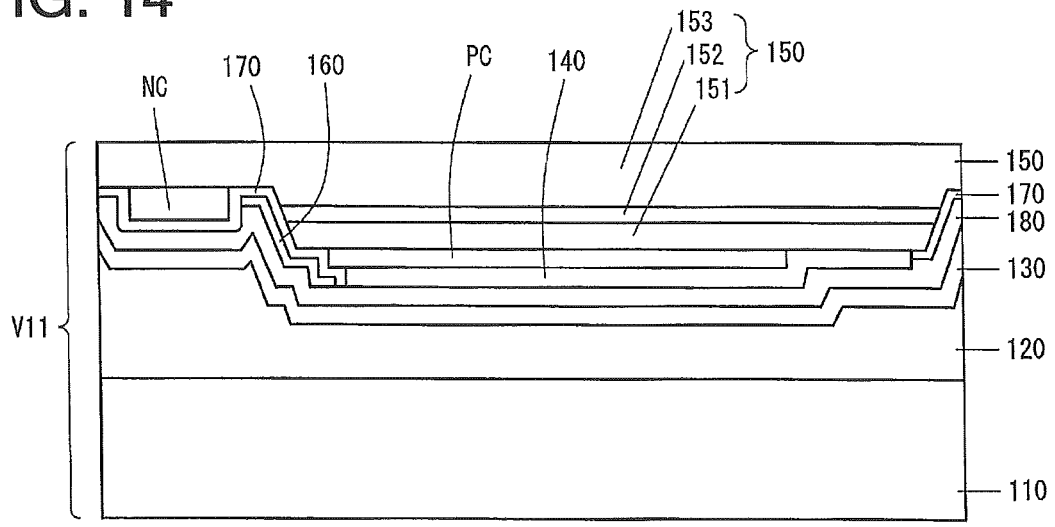
FIG. 14 is a view (eighth view) for explaining a method of manufacturing the light emitting element according to the illustrative embodiment.

After the bonded body V10 is formed, the sapphire substrate S10 that is a growth substrate is removed from the bonded body V10. For example, the sapphire substrate S10 can be removed by a laser lift-off method. FIG. 14 shows a bonded body V11 after removal of the sapphire substrate S10.

3-12. Pad Electrode Forming Process

Figure 15:
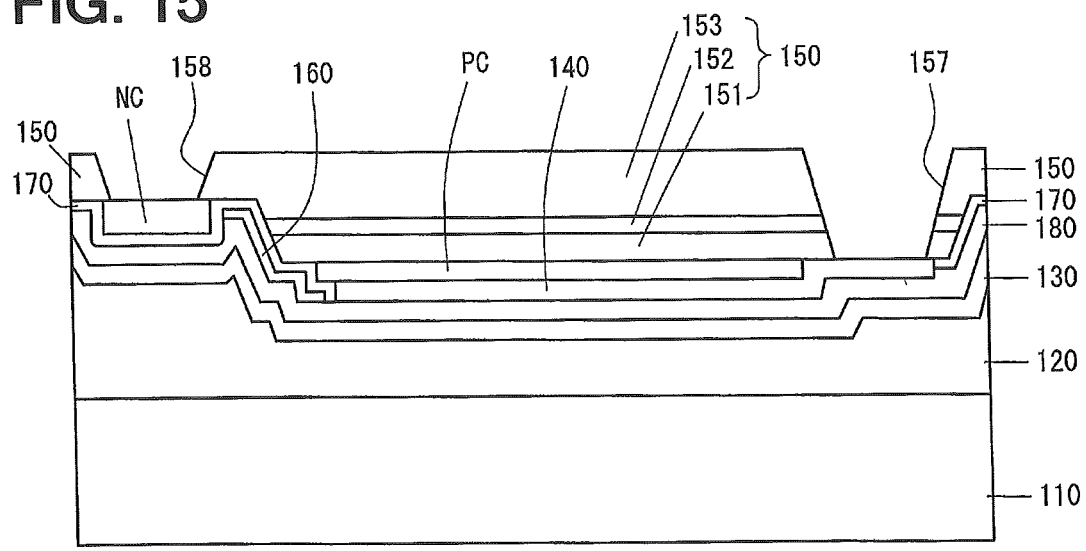
FIG. 15 is a view (ninth view) for explaining a method of manufacturing the light emitting element according to the illustrative embodiment.

Subsequently, as shown in FIG. 15, recesses 157, 158 are formed from the side of a surface 153a of the n-type semiconductor layer 153 that is exposed by the removal of the sapphire substrate S10. This work may be formed by dry etching. The etching stop layer 140 is exposed at the bottom of the recess 157. The n-contact electrode NC is exposed at the bottom of the recess 158. In other words, the formation of the recesses by the dry etching reaches the etching stop layer 140 and the n-contact electrode NC and is stopped at the site of the metal layer thereof.

Figure 16:
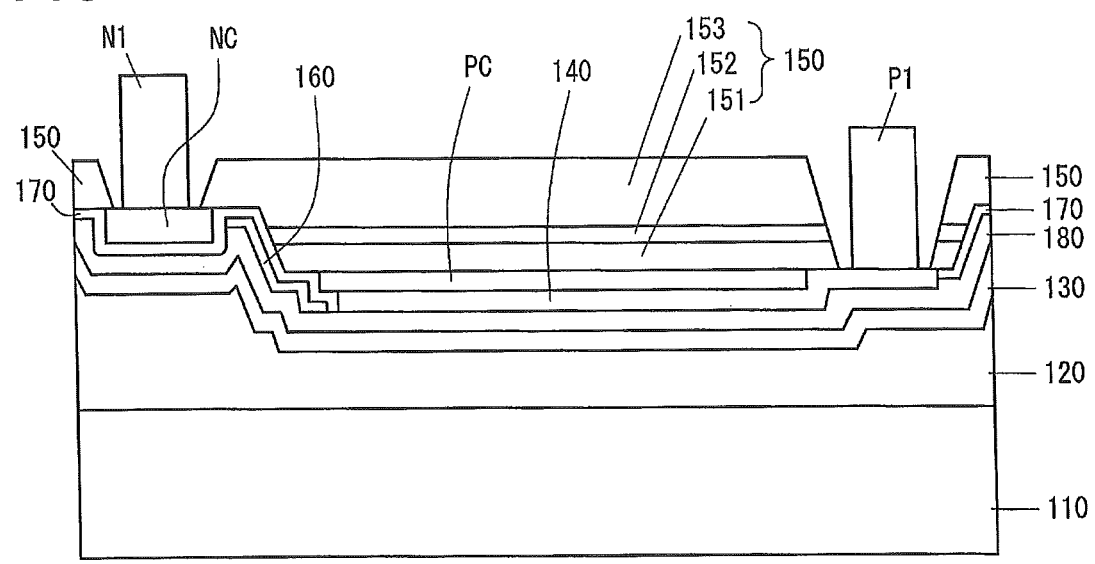
FIG. 16 is a view (tenth view) for explaining a method of manufacturing the light emitting element according to the illustrative embodiment.

Then, as shown in FIG. 16, the p-electrode P1 is formed on the etching stop layer 140 that is exposed at the bottom of the recess 157. Further, the n-electrode N1 is formed on the n-contact electrode NC that is exposed at the bottom of the recess 158.

3-13. Roughening Process

Subsequently, as shown in FIG. 17, the surface 153a of the n-type semiconductor layer 153 is roughened by etching. With this surface micromachining, light extraction efficiency in the light extraction surface 154a is improved.

3-14. Element Separation Process

Here, the elements are separated using YAG laser or the like. Of course, the elements may be separated by other methods. With this separation, the light emitting element 100 shown in FIG. 1 or the like is manufactured. In the above manufacturing process, a suitable heat treatment may be performed. Further, the above manufacturing process may be properly exchanged with each other. In particular, the p-contact electrode forming process and the n-contact electrode forming process may be exchanged with each other.

4. Manufactured Semiconductor Light Emitting Element

In the light emitting element 100 according to the present embodiment, the p-wiring electrode part PC1 and the n-wiring electrode part NC1 are disposed at a position between the semiconductor layer 150 and the support substrate 110. Other than the pad electrode, a member to be an obstacle to the light extraction does not exist on the side of the light extraction surface. Therefore, light emitting efficiency is good. Furthermore, since leakage current is suppressed, the yield is improved and also service life is longer than a conventional light emitting element. Further, the entire surface of one side of the laminate including the semiconductor layer 150 is bonded to the support substrate 110. Therefore, heat dissipation of the light emitting element 100 is high. Further, the mounting strength of the light emitting element 100 is also high.

5. Comparison with Conventional Semiconductor Light Emitting Element 5-1. Grooved (Contact Electrode)

FIG. 18 shows a conventional grooved light emitting element 200. As shown in FIG. 18, an n-contact electrode NC21 is formed along a groove 257 provided in a semiconductor layer 250. Accordingly, the n-contact electrode NC21 has a shape along the groove 257. Meanwhile, a p-contact electrode PC21 is formed in a region other than the groove 257. Accordingly, in a case of being orthogonally projected on a main surface of a support substrate 210, the n-contact electrode NC21 and the p-contact electrode PC21 are disposed in a shape and position where the orthogonally projected n-contact electrode and the orthogonally projected p-contact are not overlapped with each other. The light emitting element 200 is provided with the groove 257. This arrangement is just an inevitable configuration for forming the contact electrode in each of the site of the groove and the site without the groove.

Further, for the light emitting element 200 shown in FIG. 18, there is little possibility that the p-contact electrode PC21 and the n-contact electrode NC21 are conducted to each other even when an insulating film 270 does not exist. Accordingly, the problem that paths are formed along the grain boundaries of a thin insulating film, i.e., the problem to be solved by the present invention do not originally occur.

5-2. Embedded (Contact Electrode)

FIG. 19 shows a conventional embedded light emitting element 300. As shown in FIG. 19, the embedded light emitting element 300 in which a p-contact electrode PC31 is disposed between a semiconductor layer 350 and a support substrate 310 is different from the grooved light emitting element 200. In other words, a mechanism for limiting the shape of the p-contact electrode PC31 and an n-contact electrode NC31, e.g., a means corresponding to the above-described groove 257 (see FIG. 18) does not exist. In FIG. 19, the p-contact electrode PC31 is formed over the entire region of the light emitting surface.

Therefore, as shown in FIG. 19, there is a site 391 where the n-contact electrode NC31 and the p-contact electrode PC31 are opposed to each other through an insulating film 370. A strong electric field in a film thickness direction is generated at that site 391 when using the light emitting element 300. As the electric field is continuously generated, there is a possibility that the insulating film 370 is damaged. For example, metal atoms often move along the grain boundary of the thin insulating film 370 by the electric field and therefore paths are formed. Thereby, leakage current flows between the n-contact electrode NC31 and the p-contact electrode PC31.

On the contrary, the light emitting element 100 according to the present embodiment is an embedded element and has a configuration that the p-contact electrode PC and the n-contact electrode NC are not opposed to each other through an insulating film. Therefore, there is little possibility that leakage current flows between the p-contact electrode PC and the n-contact electrode NC.

6. Modification 6-1. Conductive Support Substrate

In the present embodiment, an insulative ceramic substrate is used as the support substrate 110. However, a conductive substrate such as a copper substrate or aluminum substrate may be used. The thermal conductivity of Cu and Al is high. Therefore, such a light emitting element has good heat dissipation and reliability thereof is high. Further, the passivation film 180 is formed over the entire surface of the cover metal layer 130. Therefore, upon using the conductive substrate, the conductive layer is insulated from the n-contact electrode NC or the p-contact electrode PC. Accordingly, there is little effect on the electric field in the interior of the light emitting element even when using the conductive substrate.

6-2. Formation of Metal Layer

Further, a metal layer may be formed on a surface of the support substrate 110 opposite to the semiconductor layer 150. The outermost surface of the metal layer is configured by Au layer or AuSn layer and therefore the light emitting element can be solder-mounted.

6-3. Electrode Shape of Light Emitting Element

In the light emitting element 100 according to the present embodiment, both the n-contact electrode NC and the p-contact electrode PC have comb-like site. However, the present invention is not limited to this shape.

6-4. Elongated Element

For example, as shown in FIG. 20, an elongated light emitting element can be also applied in the same manner as the present embodiment. The left end in FIG. 20 shows an projection view where an n-contact electrode NC40, a p-contact electrode PC40, an etching stop layer 240, an n-electrode N2 and a p-electrode P2 are orthogonally projected on a plate surface of the support substrate 110. Further, in order to the right from the second view from the left in FIG. 20, a view showing the n-contact electrode NC40, a view showing the p-contact electrode PC40, a view showing the etching stop layer 240 and views showing the n-electrode N2 and p-electrode P2 are represented. Naturally, the same may be applied to other light emitting elements, as long as the light emitting element is an embedded semiconductor light emitting element in which a contact electrode is embedded.

6-5. Removal Method of Growth Substrate

In the present embodiment, a sapphire substrate is used as a growth substrate. However, other substrates such as Si substrate may be used. Further, the present invention can be applied to a substrate lift-off type light emitting element in which other methods such as a chemical lift-off method are used to remove the growth substrate, instead of the laser lift-off method. In addition, the present invention can be applied, regardless of the manufacturing process, as long as the contact layer is disposed between the semiconductor layer and the support substrate.

6-6. Bonding Layer

In the present embodiment, the bonding layer 120 is configured by a layer bonded by an Au—Sn based solder-bonding. However, solder other than the Au—Sn based solder, or wax material may be used. Metal paste may be used.

6-7. Passivation Film of Light Extraction Surface

Further, the passivation film may be formed on the light extraction surface side.

7. Summary of Present Embodiment

The light emitting element 100 according to the present embodiment is an embedded element in which the p-contact electrode PC and the n-contact electrode NC are disposed at a position between the semiconductor layer 150 and the support substrate 110. Further, in a case of being orthogonally projected on the support substrate 110, the p-contact electrode PC and the n-contact electrode NC are arranged in a shape and position where these electrodes are not overlapped with each other. Therefore, leakage current does not occur almost between the p-contact electrode PC and the n-contact electrode NC.

Further, in the method of manufacturing the semiconductor light emitting element according to the present embodiment, in a case of being orthogonally projected on the sapphire substrate S10 that is a growth substrate, the p-contact electrode PC and the n-contact electrode NC are placed in a shape and position where the p-contact electrode PC and the n-contact electrode NC are not overlapped with each other. Therefore, in the light emitting element 100 manufactured by the above-described manufacturing method, leakage current does not occur almost between the p-contact electrode PC and the n-contact electrode NC. In other words, initial failure is difficult to occur and therefore the yield is good.

The illustrative embodiments described above are merely illustrative. Accordingly, it is natural that various improvements and modifications are possible without departing from the scope and spirit thereof. For example, the present is not limited to the metal-organic vapor phase growth (MOCVD). Other methods of growing crystal using carrier gas may be used. Further, the semiconductor layer may be formed by other epitaxial growth methods such as liquid phase epitaxy, molecular beam epitaxy.

What is claimed is:

1. A group-III nitride semiconductor light emitting element comprising:
    a semiconductor layer that includes a light emitting layer, a p-type semiconductor layer and an n-type semiconductor layer;
    a p-contact electrode that is in contact with the p-type semiconductor layer;
    an n-contact electrode that is in contact with the n-type semiconductor layer; and
    a support substrate that supports the semiconductor layer,
    wherein the p-contact electrode and the n-contact electrode are disposed at a position between the semiconductor layer and the support substrate,
    wherein the p-contact electrode and the n-contact electrode are formed in a shape in which an orthogonally projected p-contact electrode on a plate surface of the support substrate and an orthogonally projected n-contact electrode on the plate surface of the support substrate are not overlapped with each other,
    wherein the p-contact electrode comprises:
        a first part; and
        a second part arranged parallel to the first part, and
    wherein the first part is separated from the second part via a first space.

2. The group-III nitride semiconductor light emitting element according to claim 1, further comprising:
    a first passivation film disposed at a position between the p-contact electrode and the n-contact electrode.

3. The group-III nitride semiconductor light emitting element according to claim 1, wherein
    the p-contact electrode includes a comb-like p-wiring electrode part,
    the n-contact electrode includes a comb-like n-wiring electrode part, and
    an orthogonally projected p-wiring electrode part on the plate surface of the support substrate and an orthogonally projected n-wiring electrode part on the plate surface of the support substrate are arranged to be engaged with each other.

4. The group-III nitride semiconductor light emitting element according to claim 1, further comprising:
    a first metal layer that is in contact with the p-contact electrode,
    wherein the first metal layer and the n-contact electrode are formed in a shape in which an orthogonally projected first metal layer on the plate surface of the support substrate and the orthogonally projected n-contact electrode on the plate surface of the support substrate are not overlapped with each other.

5. The group-III nitride semiconductor light emitting element according to claim 4, further comprising:
    a p-pad electrode that is formed on the first metal layer; and
    an n-pad electrode that is formed on the n-contact electrode,
    wherein the p-pad electrode and the n-pad electrode are exposed on a surface opposite to the side where the support substrate is disposed, as seen from the semiconductor layer.

6. The group-III nitride semiconductor light emitting element according to claim 4, further comprising:
    a bonding layer that is located between the first metal layer and the support substrate and containing solder; and
    a second metal layer that is formed over the entire surface of the bonding layer on the semiconductor layer side,
    wherein the second metal layer is a cover metal layer for preventing the solder contained in the bonding layer from being diffused toward the first metal layer.

7. The group-III nitride semiconductor light emitting element according to claim 6, further comprising:
    a second passivation film that is formed over the entire surface of the second metal layer on the semiconductor layer side.

8. The group-III nitride semiconductor light emitting element according to claim 1, further comprising:
    a reflective film that is disposed at a position between the semiconductor layer and the support substrate,
    wherein an orthogonally projected reflective film on the plate surface of the support substrate is disposed at a position between the orthogonally projected p-contact electrode and the orthogonally projected n-contact electrode.

9. The group-III nitride semiconductor light emitting element according to claim 1, wherein a first part of the n-contact electrode is disposed outside a first edge of the p-contact electrode, and
    wherein a second part of the n-contact electrode is disposed outside a second edge of the p-contact electrode.

10. The group-III nitride semiconductor light emitting element according to claim 1,
    wherein the n-contact electrode comprises:
        a first part;
        a second part arranged parallel to the first part; and
        a third part arranged parallel to the first part,
    wherein the first part is separated from the second part via a first space,
    wherein the third part is separated from the second part via a second space, and
    wherein the second part is disposed between the first and second parts of the p-contact electrode in the first space that separates the first and second parts of the p-contact electrode.

11. The group-III nitride semiconductor light emitting element according to claim 10,
    wherein the first part of the n-contact electrode is disposed outside an edge of the first part of p-contact electrode, the edge being further from the space, and
    wherein the third part of the n-contact electrode is disposed outside an edge of the second part of p-contact electrode, the edge being further from the space.

12. The group-III nitride semiconductor light emitting element according to claim 10,
    wherein the n-contact electrode comprises:
        a connecting part which is perpendicular to the first part and connects the first part, the second part, and the third part.

13. The group-III nitride semiconductor light emitting element according to claim 1,
    wherein the n-contact electrode is disposed in the first space that separates the first part of the p-contact electrode from the second part of the p-contact electrode.

14. A method of manufacturing a group-III nitride semiconductor light emitting element, comprising:
- a semiconductor layer forming process for growing a semiconductor layer including a light emitting layer, a p-type semiconductor layer and an n-type semiconductor layer on a grow substrate;
- a recess forming process for forming a recess on the semiconductor layer from the p-type semiconductor layer side to expose a portion of the n-type semiconductor layer; an n-contact electrode forming process for forming an n-contact electrode on the n-type semiconductor layer that is exposed to the recess;
- a p-contact electrode forming process for forming a p-contact electrode on the p-type semiconductor layer;
- a bonding process for bonding a laminate including a support substrate to a base material including the semiconductor layer from the position opposite to the growth substrate to form a bonding body; and
- a growth substrate removal process for removing the growth substrate from the bonding body,
- wherein, in the n-contact electrode forming process and the p-contact electrode forming process, in a case of being orthogonally projected on a plate surface of the support substrate, the p-contact electrode and the n-contact electrode are formed in a shape in which the orthogonally projected p-contact electrode and the orthogonally projected n-contact electrode are not overlapped with each other,
- in the bonding process, the p-contact electrode and the n-contact electrode are bonded so as to be disposed at a position between the semiconductor layer and the support substrate,
- wherein the p-contact electrode comprises:
    - a first part; and
    - a second part arranged parallel to the first part, and
- wherein the first part is separated from the second part via a first space.

15. The method of manufacturing the group-III nitride semiconductor light emitting element according to claim 14, further comprising:
- a passivation film forming process for forming a passivation film that insulates between the p-contact electrode and the n-contact electrode.

16. A group-III nitride semiconductor light emitting element comprising:
- a semiconductor layer that includes a light emitting layer, a p-type semiconductor layer and an n-type semiconductor layer;
- a p-contact electrode that is in contact with the p-type semiconductor layer;
- an n-contact electrode that is in contact with the n-type semiconductor layer; and
- a support substrate that supports the semiconductor layer, wherein the p-contact electrode and the n-contact electrode are disposed at a position between the semiconductor layer and the support substrate,
- wherein the p-contact electrode and the n-contact electrode are formed in a shape in which an orthogonally projected p-contact electrode on a plate surface of the support substrate and an orthogonally projected n-contact electrode on the plate surface of the support substrate are not overlapped with each other,
- wherein the p-contact electrode comprises:
    - a first part;
    - a second part arranged parallel to the first part;
    - a third part arranged parallel to the first part; and
    - a fourth part arranged parallel to the second part,
- wherein the first part is separated from the second part via a first space,
- wherein the second part is separated from the fourth part via a second space, and
- wherein the third part is separated from the first part via a third space.

17. The group-III nitride semiconductor light emitting element according to claim 16,
- wherein the n-contact electrode comprises a plurality of parts, each part of the plurality of part being parallel to each other,
- wherein a first part, a second part, and a third part of the plurality of parts of the n-contact electrode are disposed in the first space, the second space, and the third space, respectively.

* * * * *